(12) United States Patent
Taira

(10) Patent No.: US 9,196,776 B2
(45) Date of Patent: Nov. 24, 2015

(54) SOLAR CELL MODULE

(75) Inventor: Shigeharu Taira, Amagasaki (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 614 days.

(21) Appl. No.: 12/425,461

(22) Filed: Apr. 17, 2009

(65) Prior Publication Data

US 2009/0260672 A1 Oct. 22, 2009

(30) Foreign Application Priority Data

Apr. 21, 2008 (JP) ................ JP2008-110785

(51) Int. Cl.
*H01L 31/00* (2006.01)
*H01L 31/05* (2014.01)
*H01L 31/0224* (2006.01)

(52) U.S. Cl.
CPC .... *H01L 31/0516* (2013.01); *H01L 31/022441* (2013.01); *Y02E 10/50* (2013.01)

(58) Field of Classification Search
CPC ............. H01L 31/0516; H01L 31/022441
USPC ........................................... 136/244
See application file for complete search history.

(56) References Cited

U.S. PATENT DOCUMENTS

| | | | | |
|---|---|---|---|---|
| 5,972,732 | A * | 10/1999 | Gee et al. | 438/66 |
| 6,315,575 | B1 * | 11/2001 | Kajimoto | 439/33 |
| 2005/0115602 | A1 * | 6/2005 | Senta et al. | 136/250 |
| 2005/0268959 | A1 * | 12/2005 | Aschenbrenner et al. | 136/244 |
| 2007/0095384 | A1 * | 5/2007 | Farquhar et al. | 136/244 |
| 2009/0272419 | A1 | 11/2009 | Sakamoto et al. | |

FOREIGN PATENT DOCUMENTS

| | | |
|---|---|---|
| EP | 2105970 A1 | 9/2009 |
| JP | 04-015962 A | 1/1992 |
| JP | 2005-191479 A | 7/2005 |
| JP | 2005-340362 | * 12/2005 |
| JP | 2005-340362 A | 12/2005 |
| JP | 2006324590 A | 11/2006 |
| JP | 2007-264230 A | 10/2007 |
| WO | 2006123938 A1 | 11/2006 |
| WO | 2008078741 A1 | 7/2008 |

* cited by examiner

Primary Examiner — Allison Bourke
(74) Attorney, Agent, or Firm — Marvin A. Motsenbocker; Mots Law, PLLC

(57) ABSTRACT

A first surface of a first section of a connection member includes a first conductive region, and a second surface of a second section of the connection member includes a second conductive region. The first conductive region is formed along an n-side electrode included in one solar cell, and is electrically connected to the n-side electrode. The second conductive region is formed along a p-side electrode included in a different solar cell, and is electrically connected to the p-side electrode. The first conductive region and the second conductive region are electrically connected to each other.

17 Claims, 22 Drawing Sheets

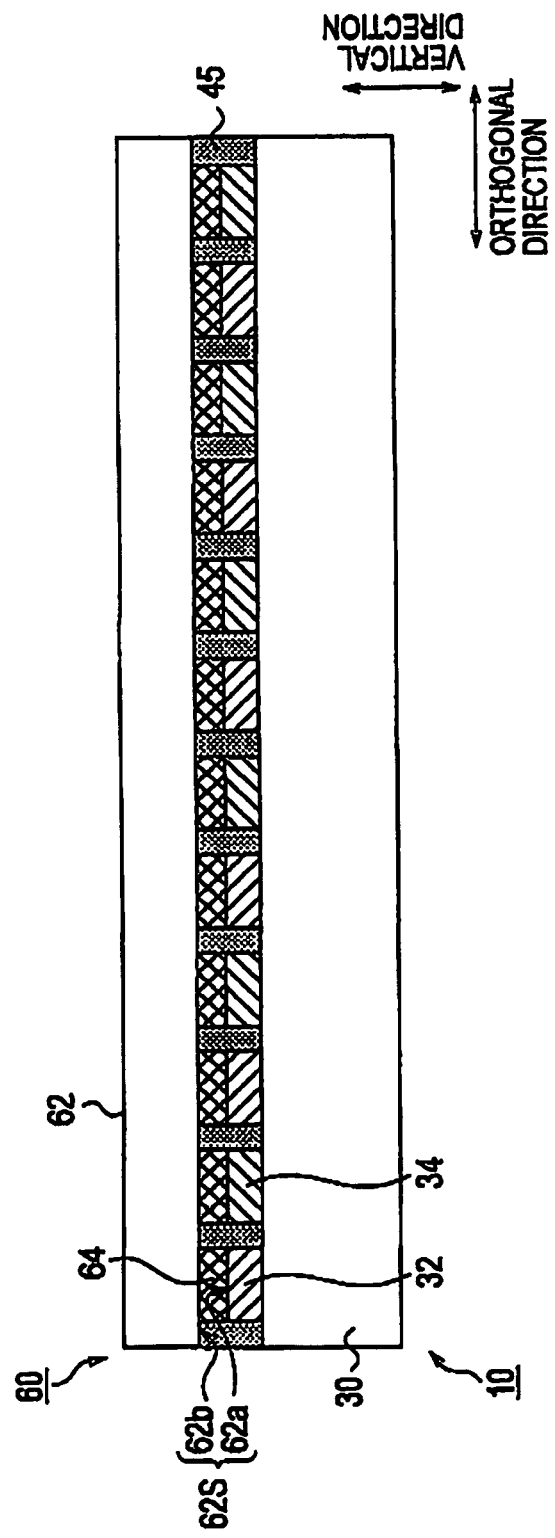

SOLAR CELL MODULE

CROSS REFERENCE TO RELATED APPLICATIONS

This application is based upon and claims the benefit of priority from prior Japanese Patent Application No. 2008-110785, filed on Apr. 21, 2008; the entire contents of which are incorporated herein by reference.

BACKGROUND OF THE INVENTION

1. Field of the Invention

The present invention relates to a solar cell module including a solar cell having n-side electrodes and p-side electrodes formed on a back surface of a photoelectric conversion part.

2. Description of the Related Art

Solar calls directly convert clean and unlimitedly-supplied sunlight into electricity. Thus, the solar cells are expected as a new energy source.

Output per solar cell is only several watts. Thus, if solar cells are used as a power source for a house, a building or the like, a solar cell module having a plurality of solar cells arranged in an arranging direction is used. The plurality of solar cells is electrically connected to each other by wiring members.

Conventionally, a so-called back surface junction type solar cell has been proposed in which a plurality of n-type regions and a plurality of p-type regions are formed in the arranging direction on the back surface side of a photoelectric conversion part (see Japanese Patent Application Publication No. 2005-191479). The n-type regions and the p-type regions are alternately formed in a direction almost orthogonal to the arranging direction. An n-side electrode for collecting electrons generated by the photoelectric conversion part is formed on each n-type region. A p-side electrode for collecting holes generated by the photoelectric conversion part is formed on each p-type region.

Here, the n-side electrodes of a first solar cell and the p-side electrodes of a second solar cell adjacent to the first solar cell are electrically connected to each other by wiring members. Specifically, one end of each n-side electrode of the first solar cell is connected to an n-side collector formed on the back surface of the photoelectric conversion part. One end of each p-side electrode of the second solar cell is connected to a p-side collector formed on the back surface of the photoelectric conversion part. The wiring members are connected to the n-side collector and the p-side collector.

Thus, the conventional back surface junction type solar cell includes the n-side collector and the p-side collector formed on the back surface of the photoelectric conversion part.

SUMMARY OF THE INVENTION

However, it is difficult to collect carriers from regions of the back surface of the photoelectric conversion part where the n-side collectors and the p-side collectors are formed. Thus, there is a problem that efficiency of collecting the carriers is difficult to improve.

The present invention has been made in light of the above problem. Accordingly, an object of the present invention is to provide a solar cell module capable of efficiently collecting carriers by the n-side electrodes and the p-side electrodes formed on the back surface.

A first aspect of the present invention is a solar cell module including: first and second solar cells arranged in an arranging direction; and a connection member configured to electrically connect the first and second solar cells. In the solar cell module, each of the first and second solar cells includes: a photoelectric conversion part having a light receiving surface and a back surface provided on an opposite side to the light receiving surface; an n-side electrode formed in the arranging direction on the back surface of the photoelectric conversion part; and a p-side electrode formed in the arranging direction on the back surface of the photoelectric conversion part, the connection member includes: a first section having a first surface opposed to the back surface of the photoelectric conversion part included in the first solar cell and a second section having a second surface opposed to the back surface of the photoelectric conversion part included in the second solar cell, the first surface includes a first conductive region formed along the n-side electrode included in the first solar cell, the second surface includes a second conductive region formed along the p-side electrode included in the second solar cell and second insulating regions each formed along the second conductive region, the first conductive region is electrically connected to the n-side electrode included in the first solar cell, the second conductive region is electrically connected to the p-side electrode included in the second solar cell, and the first conductive region and the second conductive region are electrically connected to each other.

With the solar cell module according to the first aspect of the present invention, the n-side electrode included in the first solar call and the p-side electrode included in the second solar cell are electrically connected to each other by the first and second conductive regions. Thus, the n-side electrode can be formed over substantially the whole length of the first solar cell in the arranging direction. Similarly, the p-side electrode can be formed over substantially the whole length of the second solar cell in the arranging direction. Consequently, carriers can be efficiently collected from the first and second solar cells.

In the solar cell module according to the first aspect of the present invention, the solar cell module may further include an adhesion layer provided between the connection member and the first solar cell or between the connection member and the second solar cell, and a base material of the adhesion layer may be a resin material having insulation properties. In this case, the adhesion layer may include a plurality of particles having conductivity. In addition, the adhesion layer may have conductivity in a direction almost perpendicular to the back surface and have insulation properties in a direction almost parallel to the back surface. Moreover, a diameter of each of the plurality of particles may be smaller than an interval between the n-side electrode and the p-side electrode included in the first solar cell, and smaller than an interval between the n-side electrode and the p-side electrode included in the second solar cell.

In the solar cell module according to the first aspect of the present invention, the first conductive region may be sandwiched by two first insulating regions on the first surface, the first insulating regions each formed along the first conductive region and having insulation properties, and the second conductive region may be sandwiched by two second insulating regions on the second surface, the second insulating regions each formed along the second conductive region and having insulation properties.

In the solar cell module according to the first aspect of the present invention, the first section may be arranged on a center portion in the arranging direction of the first solar cell, and the second section may be arranged on a center portion in the arranging direction of the second solar cell.

In the solar cell module according to the first aspect of the present invention, the connection member may include a third section formed of a conducting material, the third section may be electrically connected to the first section and the second section, and an insulating resin material may be arranged between the third section and the first solar cell and between the third section and the second solar cell.

In the solar cell module according to the first aspect of the present invention, the first section may cover a substantially whole region of the back surface of the photoelectric conversion part included in the first solar cell, and the second section may cover a substantially whole region of the back surface of the photoelectric conversion part included in the second solar cell.

In the solar cell module according to the first aspect of the present invention, the first and second sections may be formed integrally.

According to the present invention, a solar cell module capable of efficiently collecting carriers by n-side electrodes and p-side electrodes formed on a back surface can be provided.

BRIEF DESCRIPTION OF THE DRAWINGS

FIG. 22 is an U-U sectional view of FIG. 18.

DESCRIPTION OF THE PREFERRED EMBODIMENTS

Figure 1:
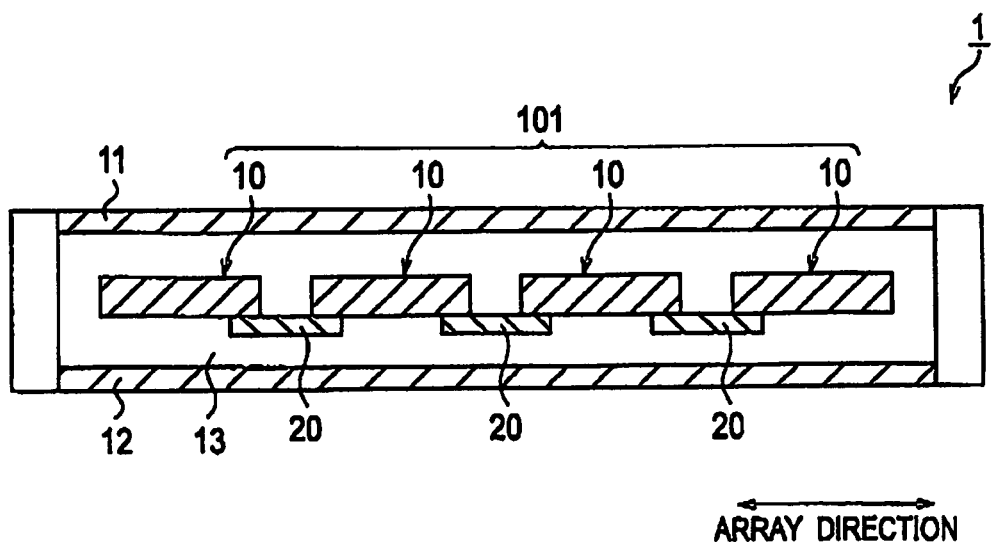
FIG. 1 is a side view showing a solar cell module 1 according to a first embodiment.

Embodiments of the present invention will be described hereinafter with reference to the drawings. In the following description of the drawings, the same or similar parts are given the same or similar reference numerals. It should be noted, however, that the drawings are schematic and the dimensional proportions and the like differ from their actual values. Hence, specific dimensions or the like should be determined by considering the following description. It is also needless to say that dimensional relationships and dimensional proportions may be different from one drawing to another in some parts.

First Embodiment (Configuration of Solar Cell Module)

A configuration of a solar cell module according to a first embodiment will be described with reference to FIG. 1. FIG. 1 is a side view showing a solar cell module 1 according to the first embodiment.

As shown in FIG. 1, the solar cell module 1 includes a solar cell string 101, a light-receiving-surface protection member 11, a back-surface protection member 12, and a sealing member 13.

The solar cell string 101 includes a plurality of solar cells 10 and connection members 20. As shown in FIG. 1, the plurality of solar cells 10 is arranged in an arranging direction. The plurality of solar cells 10 is electrically connected to each other by the connection members 20. A configuration of the solar cell string 101 will be described later.

The light-receiving-surface protection member 11 is arranged on the top surface of the solar cell module 1, and protects the light receiving surface side of each solar cell 10. The light-receiving-surface protection member 11 can be formed of a glass, plastics, or the like which have translucency and weather resistance.

The back-surface protection member 12 is arranged on the back surface of the solar cell module 1, and protects the back surface side of each solar cell 10. The back-surface protection member 12 can be formed of a single-layer body of a glass, plastics or a resin film having weather resistance, or a laminated body sandwiching a metal foil between resin films, or the like.

The sealing member 13 seals the plurality of solar cells 10 between the light-receiving-surface protection member 11 and the back-surface protection member 12. The sealing member 13 can be formed of a translucent resin such as EVA, EEA, PVB or the like.

(Configuration of Solar Cell String)

Figure 2:
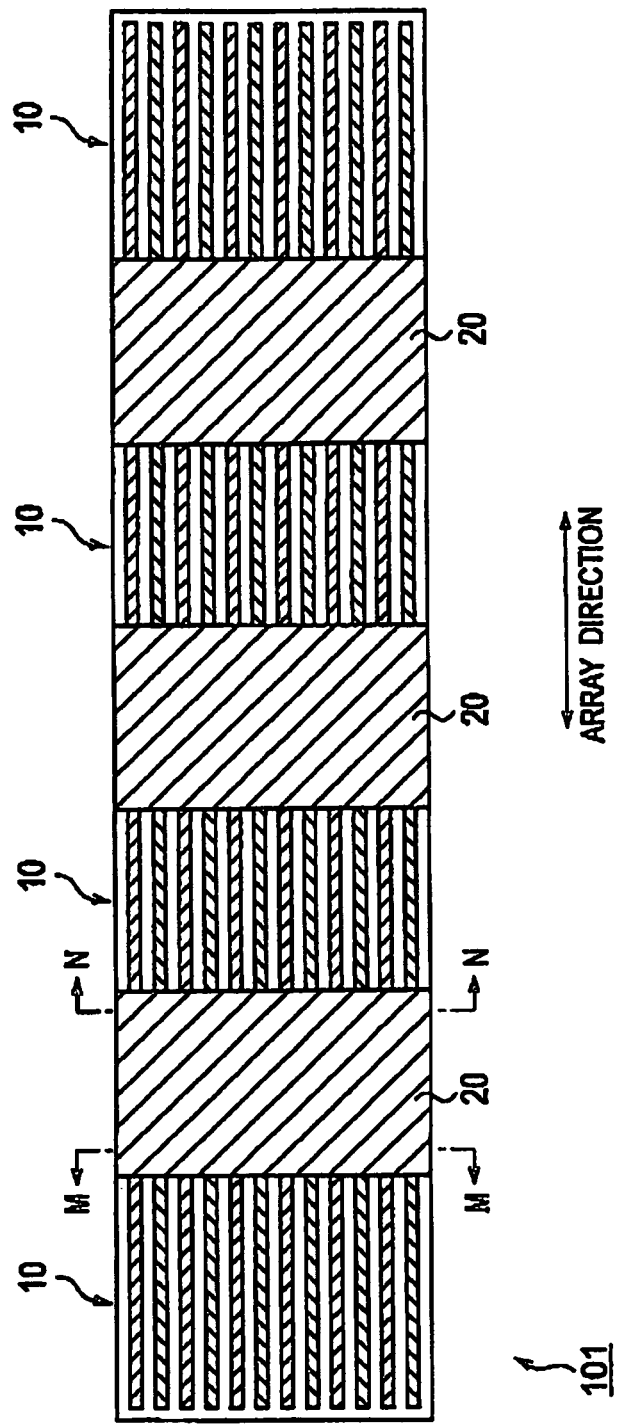
FIG. 2 is a back view of a solar cell string 101 according to the first embodiment.
Figure 3:
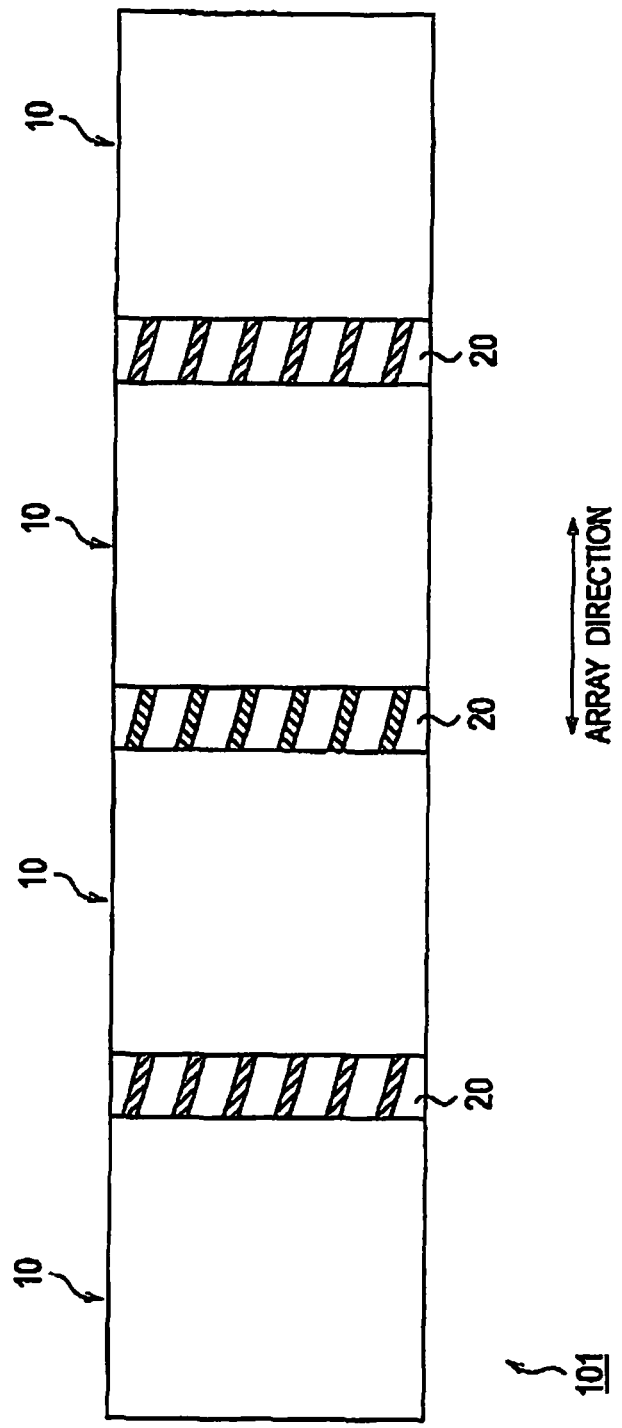
FIG. 3 is a top view of the solar cell string 101 according to the first embodiment.

FIG. 2 is a back view of the solar cell string 101. FIG. 3 is a top view of the solar cell string 101. As shown in FIGS. 2 and 3, the plurality of solar cells 10 is connected to each other by the connection members 20. A configuration of each solar cell 10 and each connection member 20 will be described hereinafter.

Figure 4:
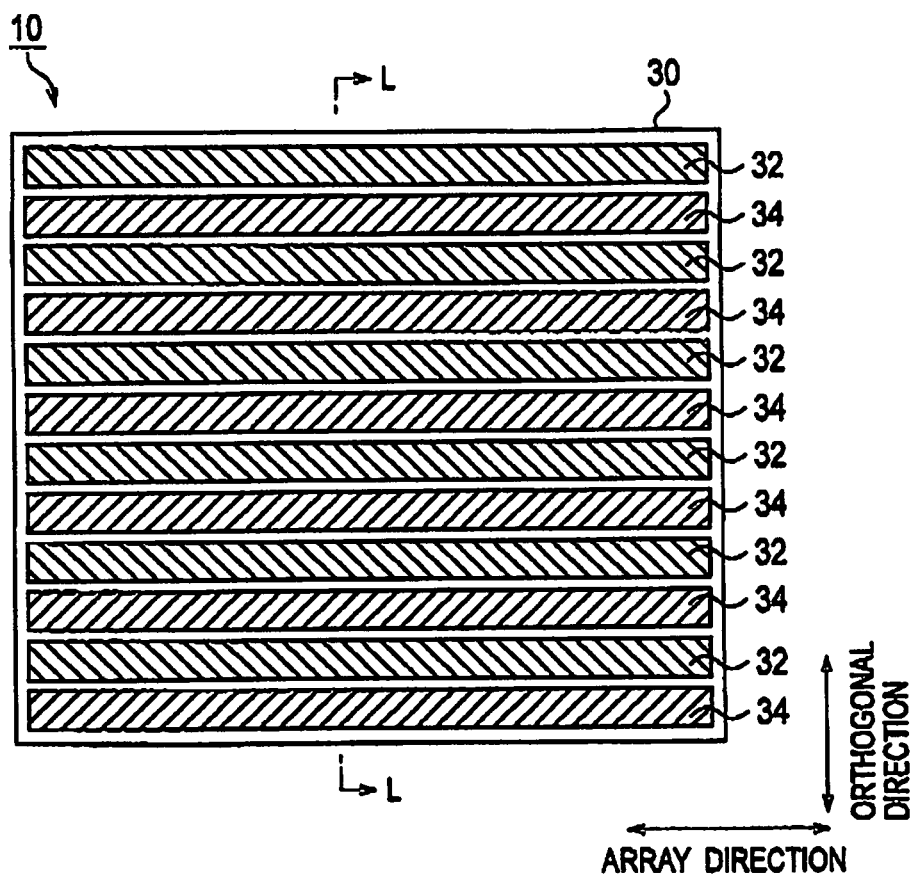
FIG. 4 is a back view of a solar cell 10 according to the first embodiment.
Figure 5:
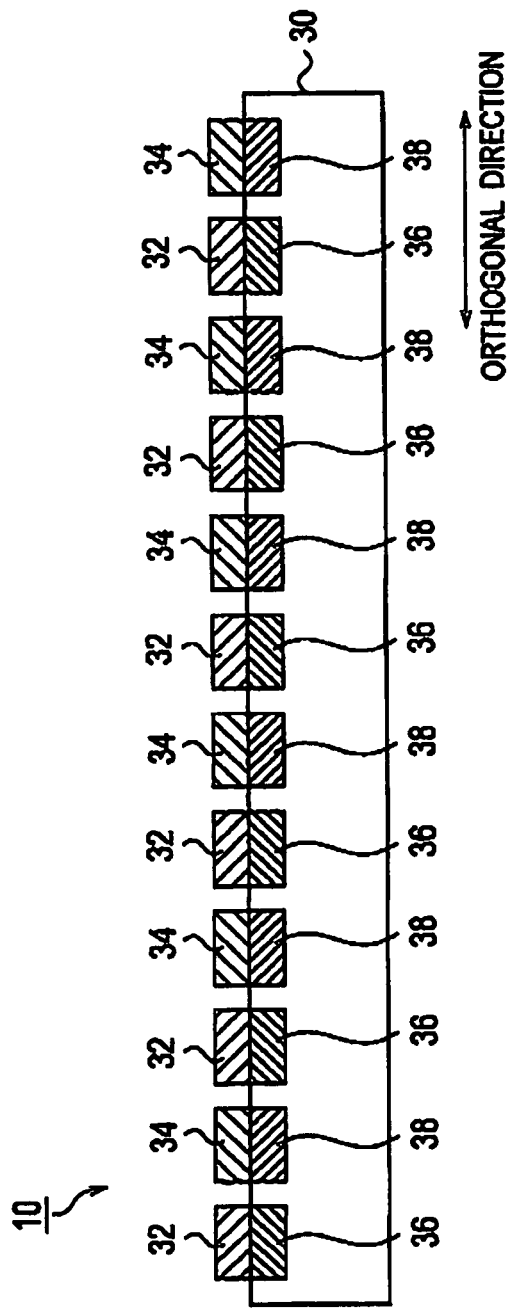
FIG. 5 is an L-L sectional view of FIG. 4.

FIG. 4 is a back view of the solar cell 10. FIG. 5 is an L-L sectional view of FIG. 4. As shown in FIG. 4, the solar cell 10 has a photoelectric conversion part 30, n-side electrodes 32, and p-side electrodes 34.

The photoelectric conversion part 30 has a light receiving surface on which light is incident and a back surface provided on an opposite side to the light receiving surface. The photoelectric conversion part 30 is formed of a general semiconducting material including a single crystal Si having either an n-type or a p-type conductivity type, a crystalline semiconducting material such as a polycrystal Si, and a compound semiconducting material such as GaAs or InP.

As shown in FIG. 5, the photoelectric conversion part 30 has n-type regions 36 and p-type regions 38 formed on the back surface side. The photoelectric conversion part 30 generates carriers by receiving light on the light receiving surface. Carriers refer to holes and electrons to be generated as a result of light being absorbed by the photoelectric conversion part 30. The n-type regions 36 and the p-type regions 38 are formed in the arranging direction over substantially a whole length of the solar cell 10. The n-type regions 36 and the p-type regions 38 are alternately formed in an orthogonal direction that is almost orthogonal to the arranging direction.

Each n-type region 36 is a high concentration n-type diffusion region formed by doping impurities (such as phosphorus) on the back surface of the photoelectric conversion part 30. Electrons build up on the n-type region 36.

Each p-type region 38 is a high concentration p-type diffusion region formed by doping impurities (such as boron, aluminum or the like) on the back surface of the photoelectric conversion part. Holes build up on the p-type region 38.

Each N-side electrode 32 is formed on the n-type region 36. Thus, the n-side electrodes 32 are formed in the arranging direction over substantially the whole length of the solar cell 10. Each n-side electrode 32 is a collecting electrode for collecting electrons building up on the corresponding one of n-type regions 36. The n-side electrode 32 can be formed by sputtering silver or printing a resin type conductive paste, a sintered type conductive paste, or the like.

Each P-side electrode 34 is formed on the p-type region 38. Thus, the p-side electrodes 34 are formed in the arranging direction over substantially the whole length of the solar cell 10. Each p-side electrode 34 is a collecting electrode for collecting holes building up on the corresponding one of p-type regions 38. The p-type electrodes 34 can be formed in a similar manner to the n-side electrode 32.

Figure 6:
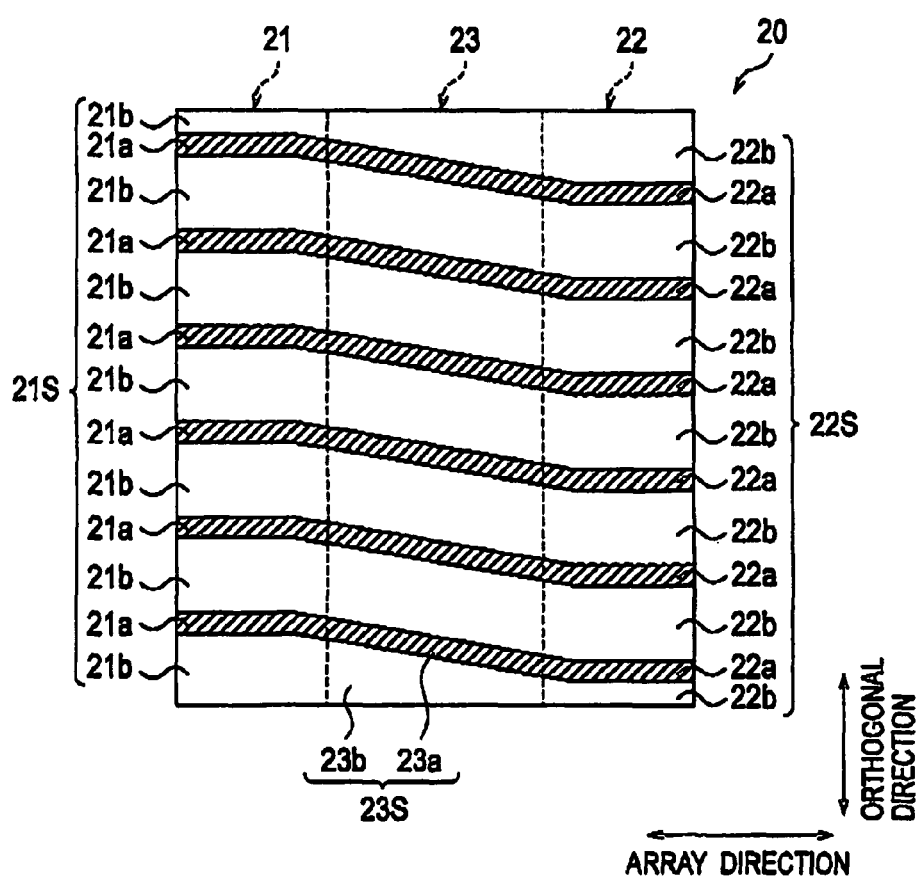
FIG. 6 is a top view of a connection member 20 according to the first embodiment.

FIG. 6 is a top view of the connection member 20. As shown in FIG. 6, the connection member 20 has a first section 21, a second section 22, and a third section 23. In the first embodiment, the connection member 20 is formed by using an insulating material such as a glass epoxy resin as a base material.

The first section 21 has a first surface 21S to be bonded to the back surface of the photoelectric conversion part 30 included in one solar cell 10. The first surface 21S includes first conductive regions 21a each having conductivity and first insulating regions 21b each having insulation properties. The first conductive regions 21a are formed along the n-side electrodes 32 included in the one solar cell 10. The first conductive regions 21a are electrically connected to the n-side electrodes 32 included in the one solar cell 10. Each first conductive region 21a is sandwiched by adjacent two of the first insulating regions 21b.

The second section 22 has a second surface 22S to be bonded to the back surface of the photoelectric conversion part 30 of a different solar call 10 that is adjacent to the one solar cell. The second surface 22S has second conductive regions 22a each having conductivity and second insulating regions 22b each having insulation properties. The second conductive regions 22a are formed along the p-side electrodes 34 included in the different solar cell 10. The second conductive regions 22a are electrically connected to the p-side electrodes 34 included in the different solar cell 10. Each second conductive region 22a is sandwiched by adjacent two of the second insulating regions 22b.

The third section 23 is a portion sandwiched by the first section 21 and the second section 22 of the connection member 20. Thus, the third section 23 has a third surface 23S (see FIG. 3) to be exposed between the one solar cell 10 and the different solar cell 10 (see FIG. 3). The third surface 23S has third conductive regions 23a each having conductivity and third insulating regions 23b each having insulation properties.

Here, as shown in FIG. 6, the first conductive regions 21a and the second conductive regions 22a are electrically connected by the third conductive regions 23a.

Figure 7:
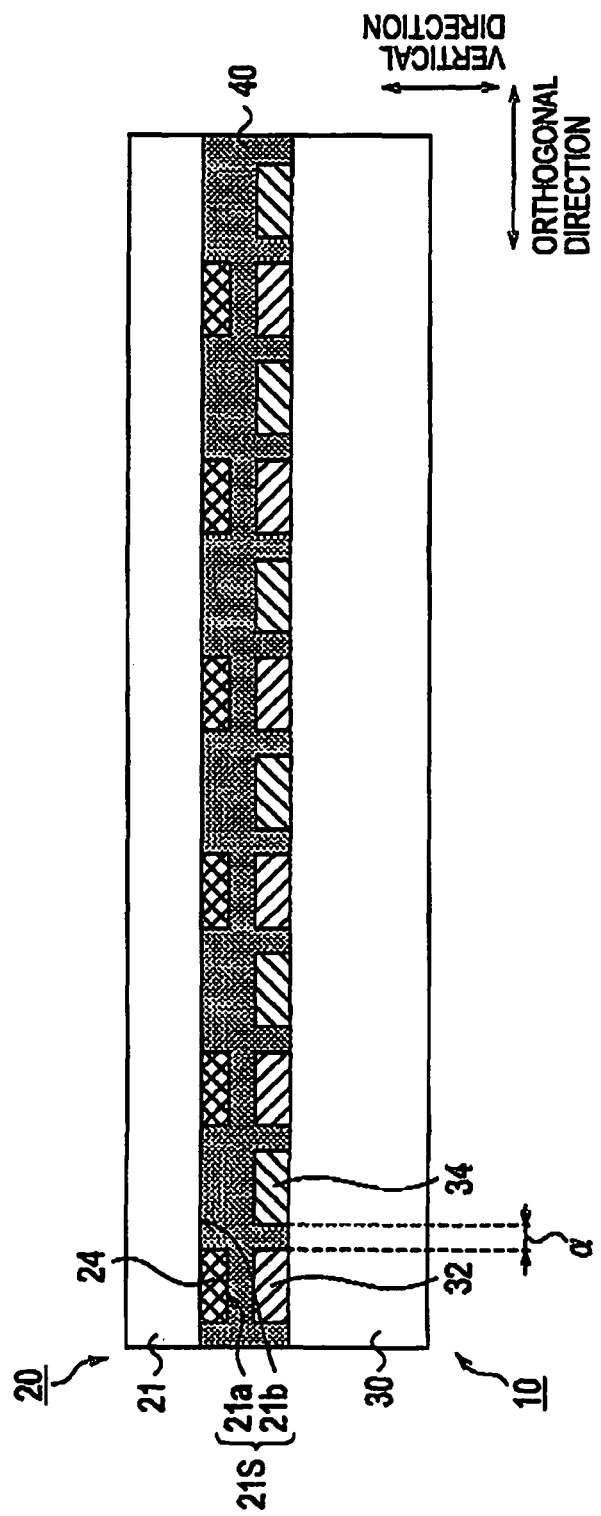
FIG. 7 is an M-M sectional view of FIG. 2.

FIG. 7 is an M-M sectional view of FIG. 2. As shown in FIG. 7, the first section 21 of the connection member 20 has conductors 24 formed on a base material (insulating material) of the connection member 20. The first conductive region 21a is composed of a surface of each conductors 24. The first conductive region 21a faces the n-side electrode 32 included in the one solar cell 10. The first insulating region 21b is composed of a surface of the base material (insulating material) of the connection member 20. The first insulating region 21b faces the p-side electrode 34.

Here, an adhesion layer 40 is provided between the one solar cell 10 and the connection member 20 (first section 21). The adhesion layer 40 bonds the connection member 20 to the one solar cell 10. As the adhesion layer 40, an anisotropic conductive film (ACF) can be used.

Specifically, the adhesion layer 40 includes a resin having insulation properties as a base material and a plurality of particles having conductivity. As a base material of the adhesion layer 40, a two-liquid reaction type adhesive or the like obtained by mixing an epoxy resin, an acrylic resin or a urethane resin with a curing agent can be used, in addition to a thermosetting resin adhesives such as an acrylic resin, a highly flexible polyurethane series. As particles having conductivity, nickel, gold-coated nickel or the like can be used.

Such the adhesion layer 40 has conductivity in a vertical direction almost perpendicular to the back surface of the one solar cell 10 and has insulation properties in a direction almost parallel to the back surface. Thus, the n-side electrode 32 included in the one solar cell 10 is electrically connected to the first conductive region 21a. In contrast, the p-side electrode 34 included in the one solar cell 10 is electrically isolated from the first conductive region 21a.

In addition, preferably, a diameter of each of the plurality of particles contained in the adhesion layer 40 is smaller than an interval α (see FIG. 7) formed between the n-side electrode 32 and the p-side electrode 34 included in the one solar cell 10.

Figure 8:
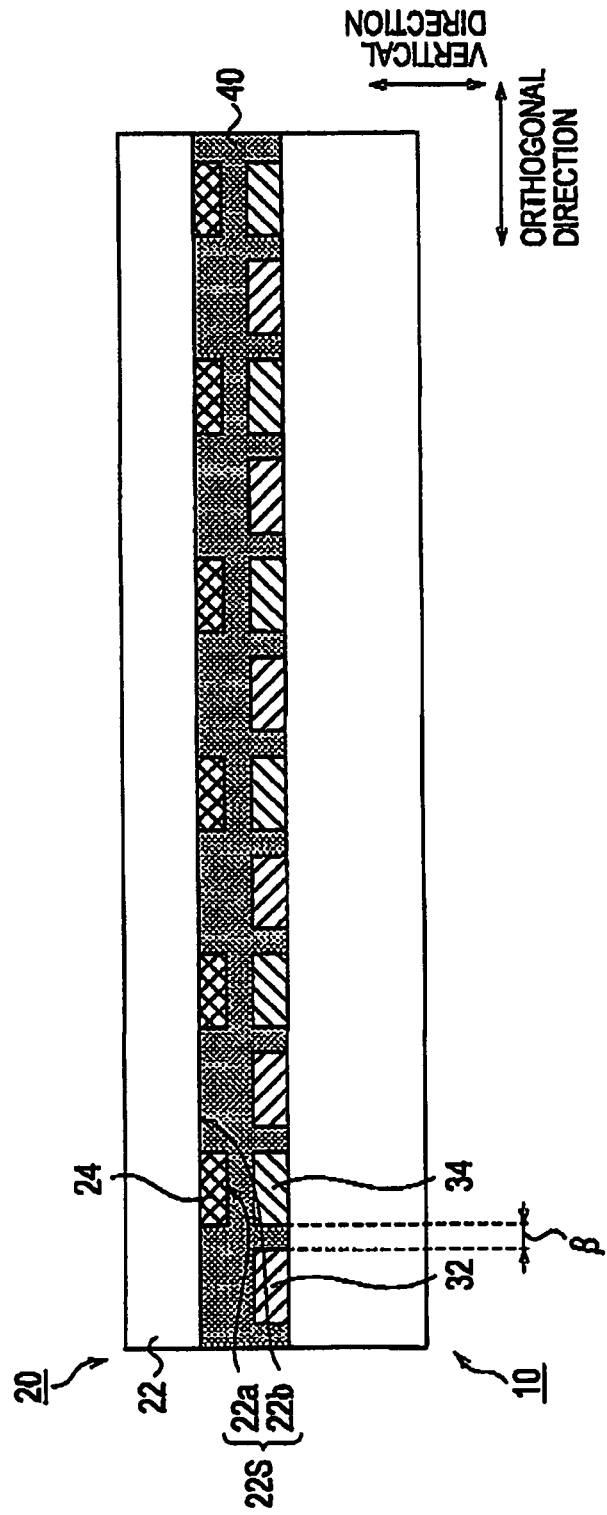
FIG. 8 is an N-N sectional view of FIG. 2.

FIG. 8 is an N-N sectional view of FIG. 2. As shown in FIG. 8, the second section 22 of the connection member 20 has the conductors 24 formed on the base material (insulating material) of the connection member 20. The second conductive region 22a is composed of the surface of each conductors 24. The second conductive region 22a faces the p-side electrode 34 included in the different solar cell 10. The second insulating region 22b is composed of the surface of the base material (insulating material) of the connection member 20. The second insulating region 22b faces the n-side electrode 32.

In addition, the adhesion layer 40 is also provided between the different solar cell 10 and the connection member 20 (second section 22). Thus, the p-side electrode 34 included in the different solar cell 10 is electrically connected to the second conductive region 22a. In contrast, the n-side electrode 32 included in the different solar cell 10 is electrically isolated from the second conductive region 22a.

Incidentally, preferably, a diameter of each of the plurality of particles contained in the adhesion layer 40 is smaller than an interval β (see FIG. 8) formed between the n-side electrode 32 and the p-side electrode 34 included in the different solar cell 10.

(Operations and Effects)

In the first embodiment, the first surface 21S of the first section 21 of the connection member 20 includes the first conductive regions 21a, and the second surface 22S of the second section 22 of the connection member 20 includes the second conductive regions 22a. The first conductive regions 21a are formed along the n-side electrodes 32 included in the one solar cell 10, and are electrically connected to the n-side electrodes 32. The second conductive regions 22a are formed along the p-side electrodes 34 included in the different solar cell 10, and are electrically connected to the p-side electrodes 34. The first conductive regions 21a and the second conductive regions 22a are electrically connected.

In this way, the n-side electrodes 32 included in the one solar cell 10 and the p-side electrodes 34 included in the different solar cell 10 are electrically connected by the first conductive regions 21a and the second conductive regions 22a. Thus, on the back surface of the photoelectric conversion part 30 included in the one solar cell 10, the n-side electrodes 32 can be formed in the arranging direction over substantially the whole length of the one solar cell 10. Similarly, on the back surface of the photoelectric conversion part 30 included in the different solar cell 10, the p-side electrodes 34 can be formed in the arranging direction over substantially the whole length of the different solar cell 10. Consequently, carriers can be collected efficiently from the one solar cell 10 and the different solar cell 10.

In addition, the solar cell module 1 according to the first embodiment includes the adhesion layers 40 provided between the connection member 20 and the one solar cell 10 and between the connection member 20 and the different solar cell 10. The adhesion layers 40 include a resin material having insulation properties and the plurality of particles having conductivity. The adhesion layers 40 have conductivity in a vertical direction that is almost perpendicular to the back surface of the photoelectric conversion part 30.

Thus, in the one solar cell 10, insulation properties of the n-side electrodes 32 with the p-side electrodes 34 can be ensured, while the connection members 20 and the n-side electrodes 32 are electrically connected. Similarly, in the different solar cell 10, insulation properties of the n-side electrodes 32 with the p-side electrodes 34 can be ensured, while the connection members 20 and the p-side electrodes 34 are electrically connected.

In addition, a diameter of each of the plurality of particles is smaller than the interval α formed between the n-side electrode 32 and the p-side electrode 34 of the one solar cell 10, and smaller than the interval β formed between the n-side electrode 32 and the p-side electrode 34 of the different solar cell 10. Thus, the particles can suppress short-circuiting between the n-side electrode 32 and the p-side electrode 34.

Second Embodiment

A second embodiment will be described hereinafter with reference to the drawings. In the second embodiment, connection members are separated into a first section and a second section. The first section and the second section are electrically connected by a conductor.

(Configuration of Solar Cell Module)

Figure 9:
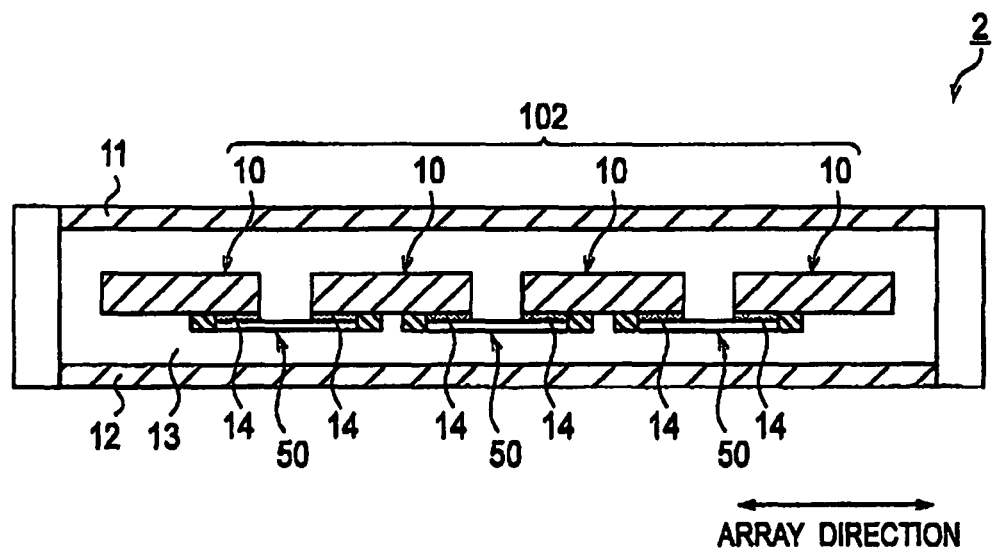
FIG. 9 is a side view of a solar cell module 2 according to a second embodiment.

A configuration of a solar cell module according to the second embodiment will be described with reference to FIG. 9. FIG. 9 is a side view showing a solar cell module 2 according to the second embodiment.

As shown in FIG. 9, the solar cell module 2 includes a solar cell string 102. The solar cell string 102 includes the plurality of solar cells 10, buffer members 14, and connection members 50.

(Configuration of Solar Cell String)

Figure 10:
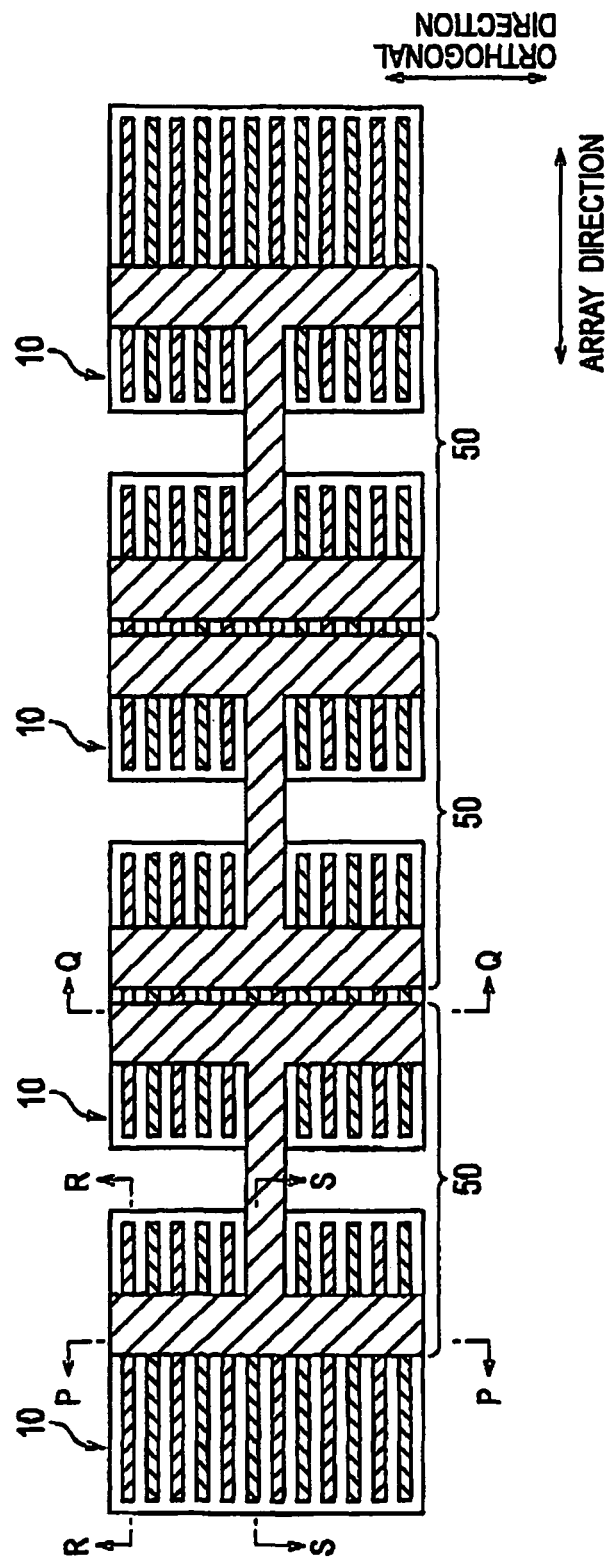
FIG. 10 is a back view of a solar cell string 102 according to the second embodiment.
Figure 11:
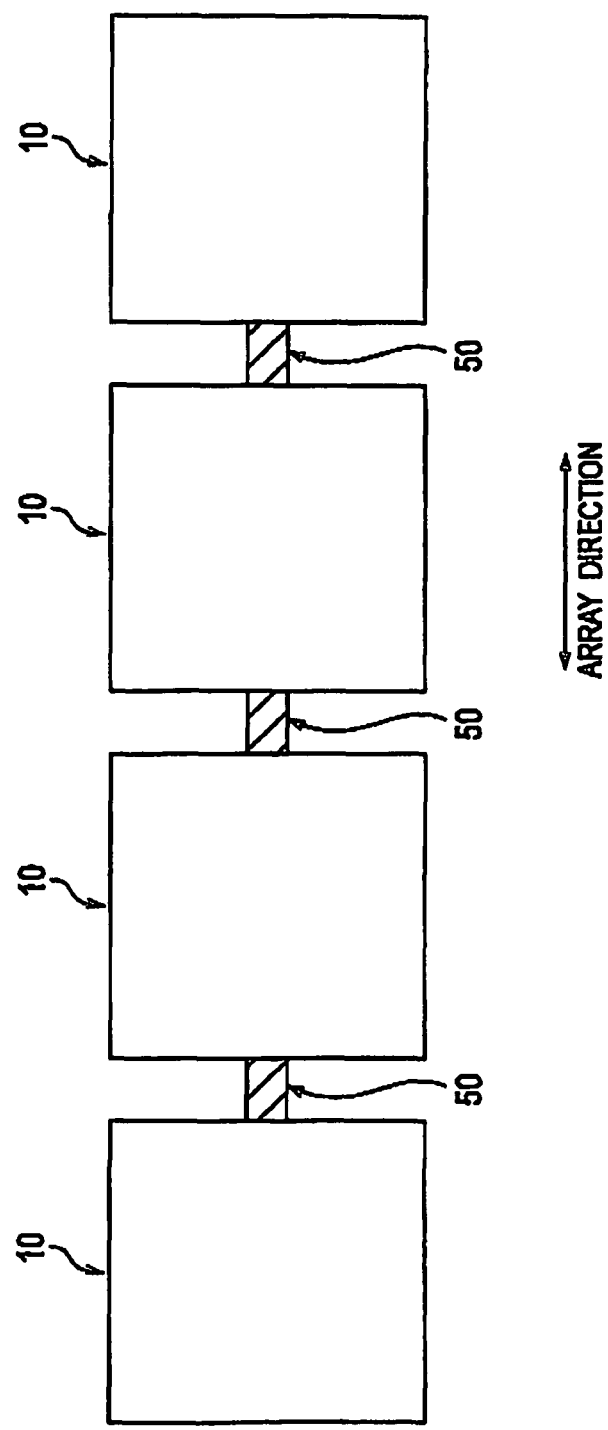
FIG. 11 is a top view of the solar cell string 102 according to the second embodiment.

FIG. 10 is a back view of the solar cell string 102. FIG. 11 is a top view of the solar cell string 102. As shown in FIGS. 10 and 11, the plurality of solar cells 10 is connected to each other by the connection members 50. A configuration of each connection member 50 will be described herein after. Note that, a configuration of each solar cell 10 is similar to that of the first embodiment.

Figure 12:
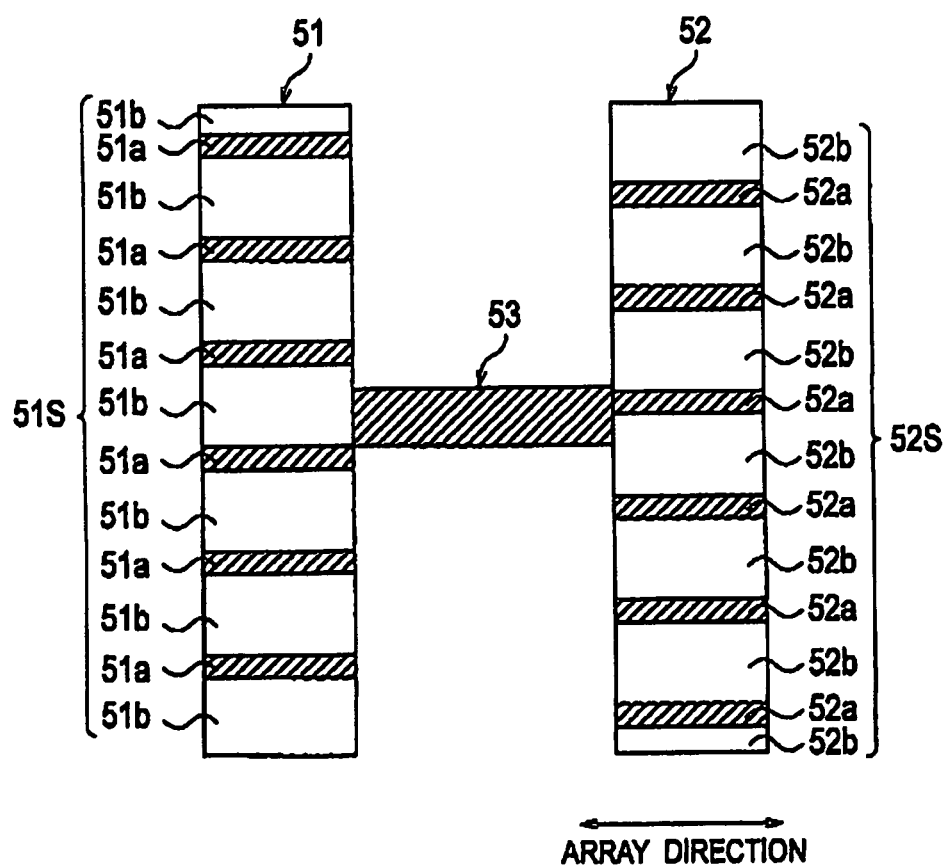
FIG. 12 is a top view of a connection member 50 according to the second embodiment.

FIG. 12 is a top view of the connection member 50 according to the second embodiment. As shown in FIG. 12, the connection member 50 includes a first section 51, a second section 52, and a third section 53. In the second embodiment, the connection member 50 is formed of a conducting material such as a thin copper sheet as a base material.

The first section 51 has a first surface 51S to be bonded to the back surface of the photoelectric conversion part 30 included in one solar cell 10. The first surface 51S includes first conductive regions 51a having conductivity and first insulating regions 51b having insulation properties. The first conductive regions 51a are formed along n-side electrodes 32 included in the one solar cell 10. The first conductive regions 51a are each electrically connected to each n-side electrode 32 included in the one solar cell 10. Each first conductive region 51a is sandwiched by adjacent two of the first insulating regions 51b. Note that, in the second embodiment, the first section 51 is arranged in the center portion, in the arranging direction, of the one solar cell 10, as shown in FIG. 10.

The second section 52 has a second surface 52S to be bonded to the back surface of the photoelectric conversion part 30 included in a different solar cell 10. The second surface 52S includes second conductive regions 52a having conductivity and second insulating regions 52b having insulation properties. The second conductive regions 52a are formed along p-side electrodes 34 included in the different solar cell 10. The second conductive regions 52a are each electrically connected to each p-side electrode 34 included in the different solar cell 10. Each second conductive region 52a is sandwiched by adjacent two of the second insulating regions 52b. Note that, in the second embodiment, the second section 52 is arranged in the center portion, in the arranging direction, of the different solar cell 10, as shown in FIG. 10.

The third section 53 is a conductor for electrically connecting the first section 51 and the second section 52. The third section 53 is exposed between the one solar cell 10 and the different solar cell 10 (See FIG. 11).

Figure 13:
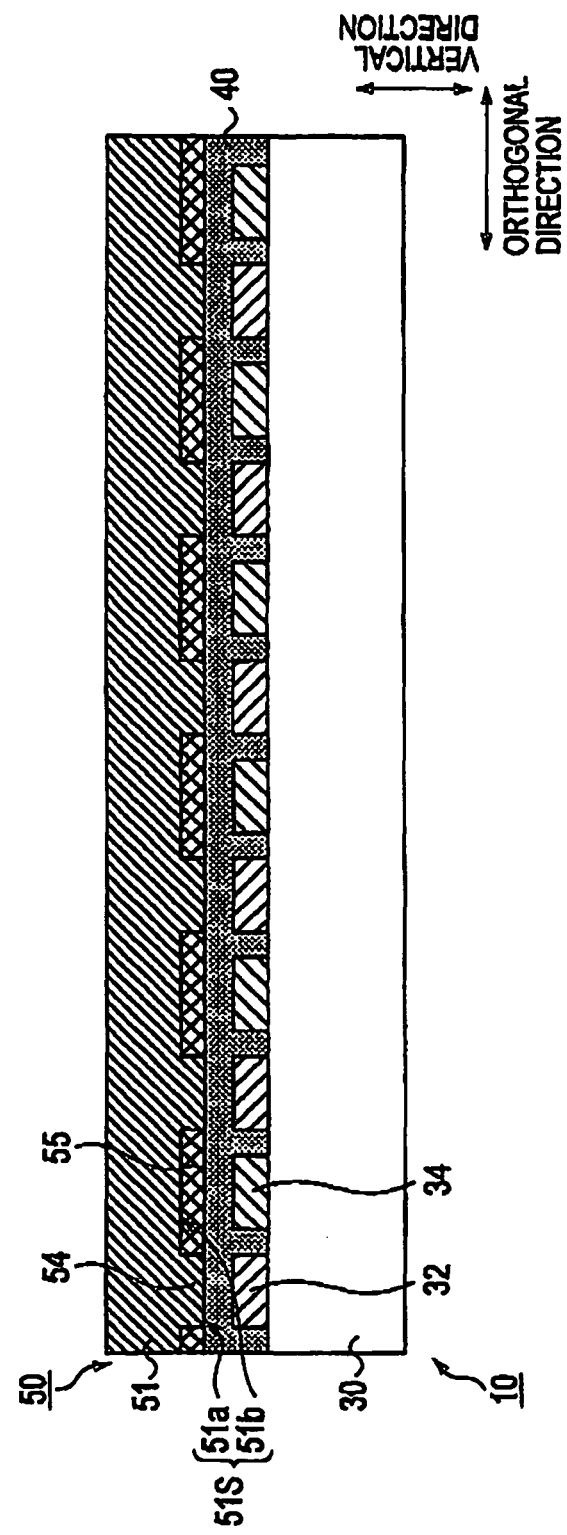
FIG. 13 is a P-P sectional view of FIG. 10.

FIG. 13 is a P-P sectional view of FIG. 10. As shown in FIG. 13, the first section 51 of the connection member 50 has conductors 54 and insulators 55. The first conductive region 51a is composed of a surface of the conductor 54. The first conductive region 61a faces the n-side electrode 32 included in the one solar cell 10. The first insulating region 61b is composed of a surface of each insulators 55. The first insulating region 51b faces the p-side electrode 34.

Figure 14:
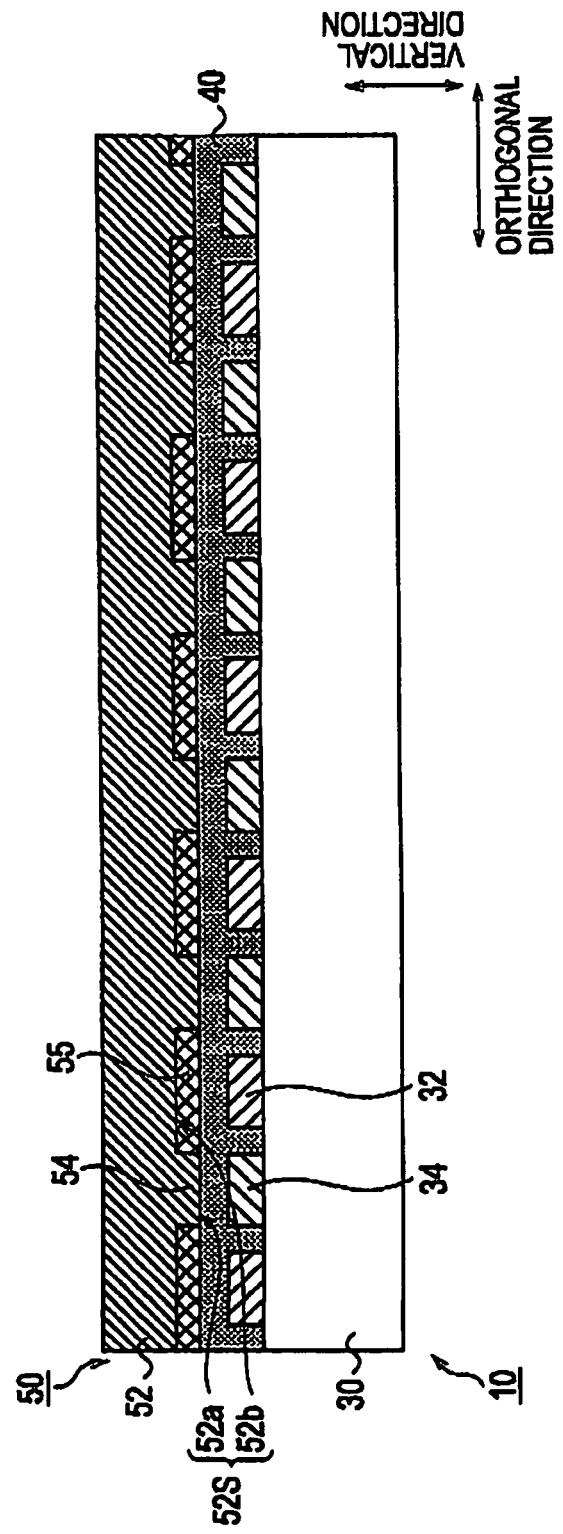
FIG. 14 is a Q-Q sectional view of FIG. 10.

FIG. 14 is a Q-Q sectional view of FIG. 10. As shown in FIG. 14, the second section 52 of the connection member 50 has the conductors 54 and the insulators 55. The second conductive region 52a is the surface of the conductor 54. The second conductive region 52a faces the p-side electrode 34 included in the different solar cell 10. The second insulating region 52b is composed of the surface of the insulator 55. The second insulating region 52b faces the n-side electrode 32.

Incidentally, the insulators 55 can be formed by selectively insulating a surface of the first section 21. Additionally, an adhesion layer 40 is provided between the solar cell 10 and the connection member 50. Thus, the n-side electrode 32 included in the one solar cell 10 is electrically connected to the first conductive region 51a. In contrast, the p-side electrode 34 included in the one solar cell 10 is electrically isolated from the first conductive region 51a.

Figure 15:
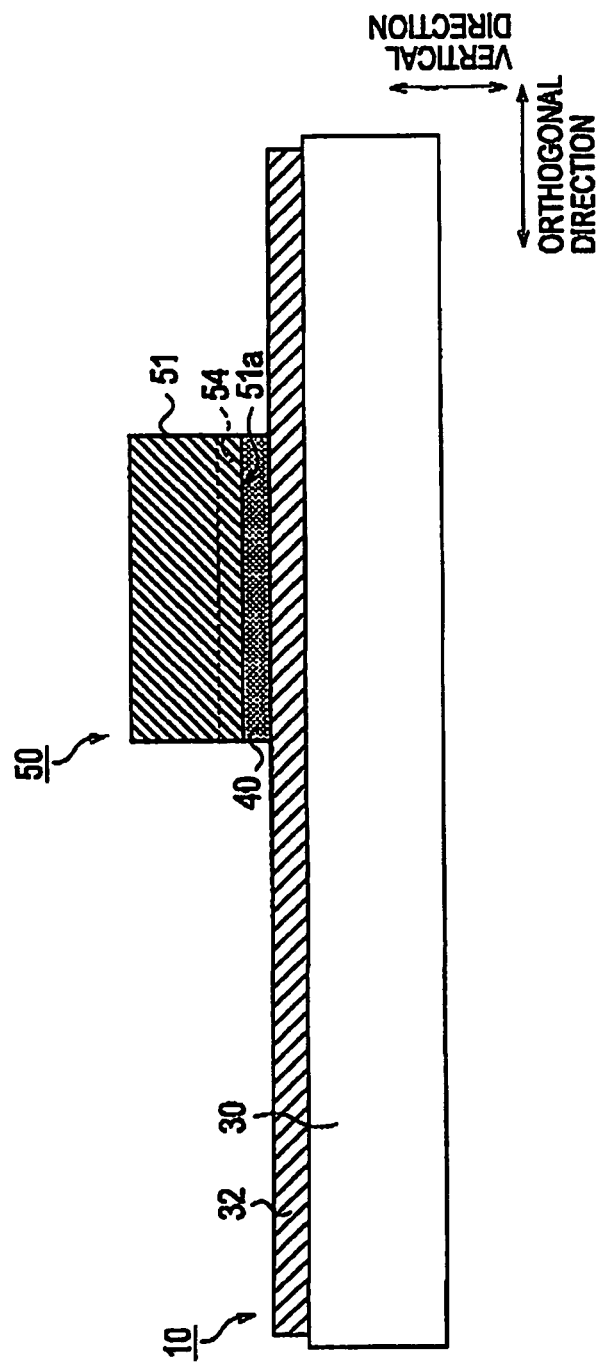
FIG. 15 is an R-R sectional view of FIG. 10.

FIG. 15 is an R-R sectional view of FIG. 10. As shown in FIG. 15, the first conductive region 51a of the first section 51 of the connection member 50 is electrically connected via the adhesion layer 40 to the n-side electrode 32 included in the one solar cell 10.

Figure 16:
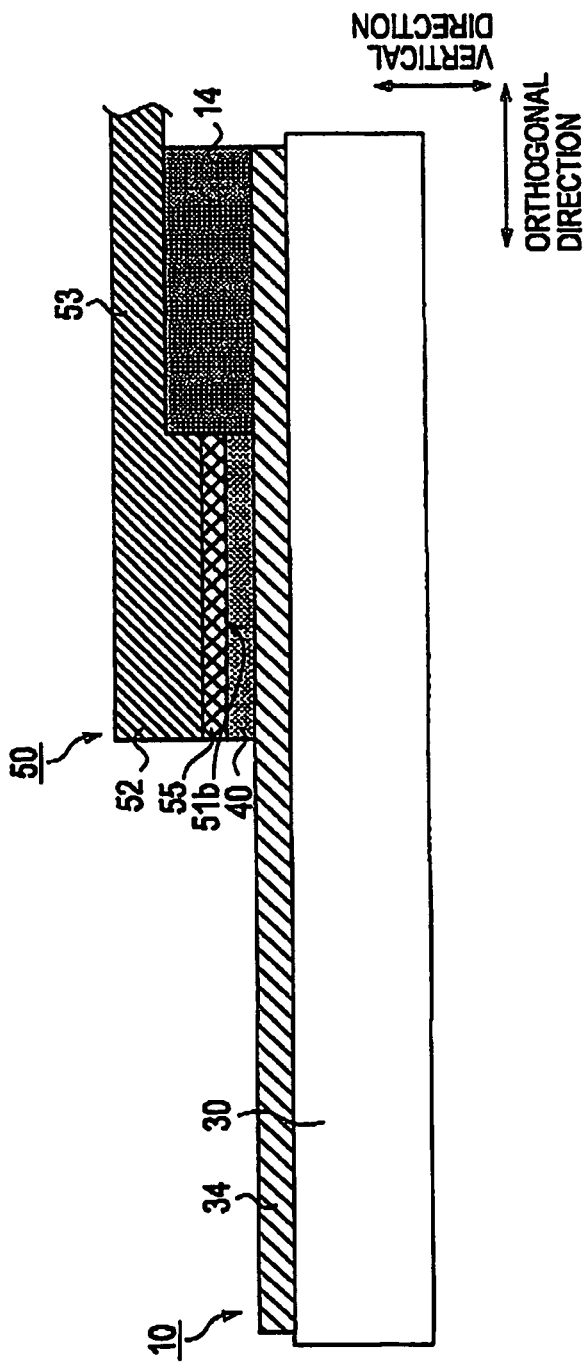
FIG. 16 is an S-S sectional view of FIG. 10.

FIG. 16 is an S-S sectional view of FIG. 10. As shown in FIG. 16, the first insulating region 51*b* of the first section 51 is connected via the adhesion layer 40 to the p-side electrode 34 included in the one solar cell 10. The first insulating region 51*b* and the p-side electrode 34 are electrically isolated.

As shown in FIG. 16, a buffer member 14 is arranged between the third section 53 and the one solar cell 10. Similar to the sealing member 13, the buffer member 14 can be formed of a resin material such as EVA, EEA, and PVB.

(Operations and Effects)

In the second embodiment, the first conductive regions 51*a* are formed along the n-side electrodes 32 included in the one solar cell 10 and are electrically connected to the n-side electrodes 32. The second conductive regions 52*a* are formed along the p-side electrodes 34 included in the different solar cell 10 and are electrically connected to the p-side electrodes 34. The first conductive regions 51*a* and the second conductive regions 52 are electrically connected.

Thus, the n-side electrodes can be formed over substantially the whole length of the one solar cell 10 and the p-side electrodes 34 can be formed over substantially the whole length of the different solar cell 10. Consequently, carriers can be efficiently collected from the one solar cell 10 and the different solar cell 10.

In addition, in the second embodiment, the first section 51 is arranged in the center portion, in the arranging direction, of the one solar cell 10, and the second section 52 is arranged in the center portion, in the arranging direction, of the different solar cell 10. Thus, a distance of carriers traveling inside the n-side electrode 32 or the p-side electrode 34 can be shortened. Accordingly, resistance loss of carriers within the n-side electrode 32 or the p-side electrode 34 can be reduced.

In addition, in the second embodiment, the first section 51 is arranged in the center portion, in the arranging direction, of the one solar cell 10, and the second section 52 is arranged in the center portion, in the arranging direction, of the different solar cell 10. Thus, this can prevent the connection member 50 from being pressed against ends, in the arranging direction, of the one solar cell 10 and the different solar cell 10. Consequently, any crack or chip that may occur at ends of the one solar cell 10 and the different solar cell 10 can be prevented.

In addition, the buffer member 14 is arranged between the third section 53 and the one solar cell 10 and between the third section 53 and the different solar cell 10. Thus, any breakage of the solar cell 10 that may occur by the third section 53 having conductivity coming into contact with the solar cell 10 can be prevented. In addition, short-circuiting between the third section 53 and the solar cell 10 can also be suppressed.

Third Embodiment

A third embodiment will be described hereinafter with reference to the drawings. In the third embodiment, a connection member covers a back surface of a solar cell.

(Configuration of Solar Cell Module)

Figure 17:
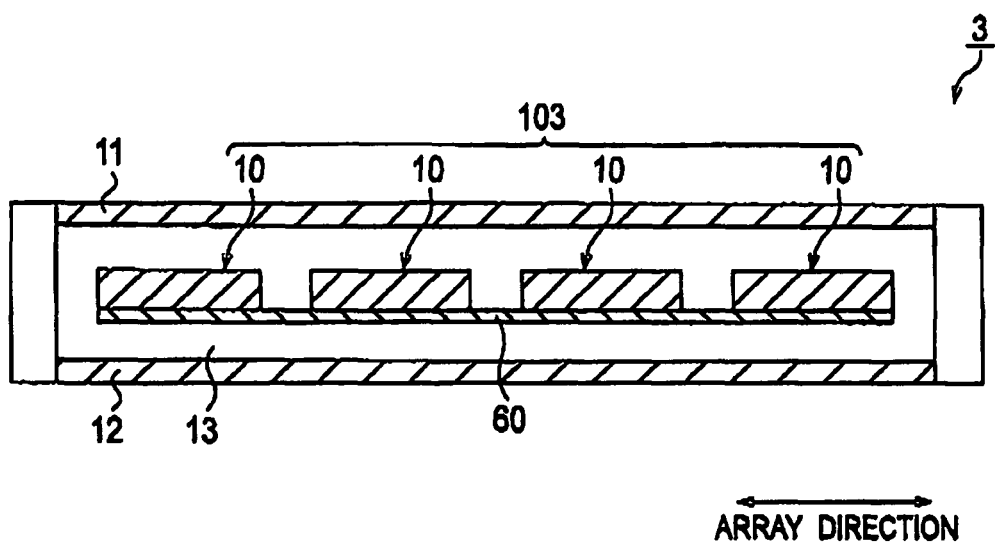
FIG. 17 is a side view showing a solar cell module 3 according to a third embodiment.

A configuration of a solar cell module according to the third embodiment will be described with reference to FIG. 17. FIG. 17 is a side view of a solar cell module 3 according to the third embodiment.

As shown in FIG. 17, the solar cell module 3 includes a solar cell string 103. The solar cell string 103 includes the plurality of solar cells 10 and a connection member 60.

(Configuration of Solar Cell String)

Figure 18:
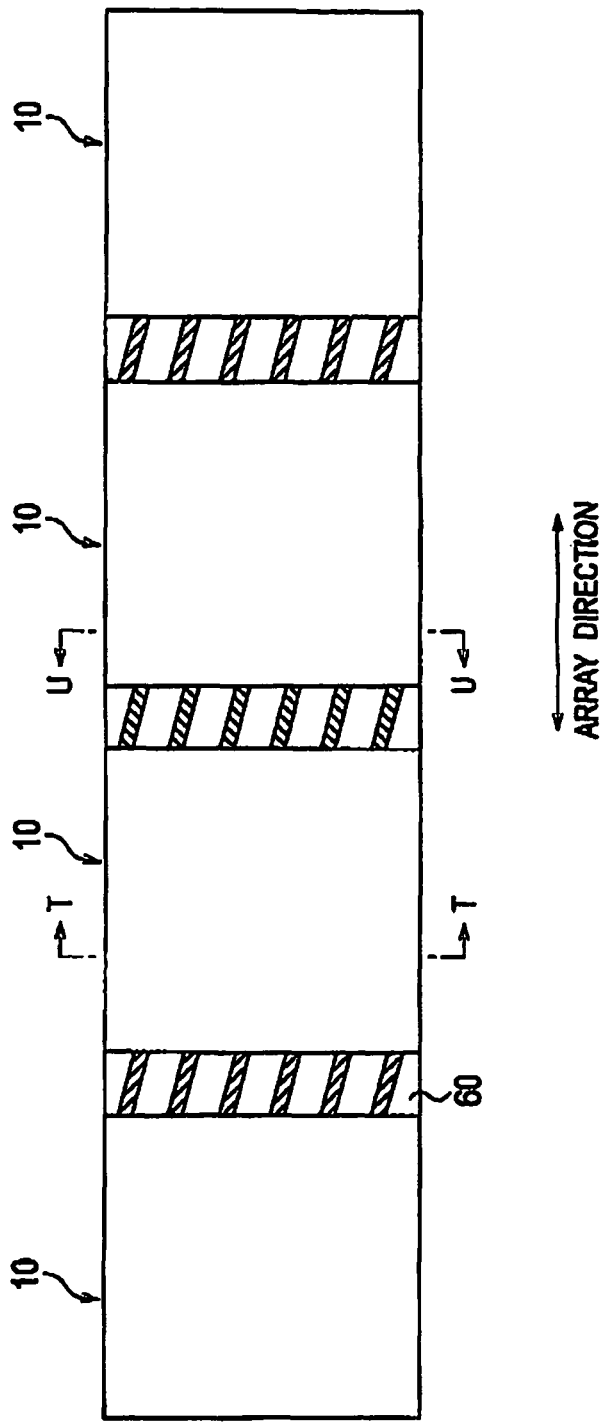
FIG. 18 is a top view of a solar cell string 103 according to the third embodiment.

FIG. 18 is a top view of the solar cell string 103 according to the third embodiment. As shown in FIG. 1B, the top view of the solar cell string 103 is similar to the solar cell string 101 according to the first embodiment. In the third embodiment, however, the plurality of solar cells 10 is arranged on the connection member 60. The connection member 60 covers the back surfaces of the plurality of solar cells 10. A configuration of the connection member 60 will be described hereinafter. Note that, a configuration of each solar cell 10 is the same as that of the first embodiment.

Figure 19:
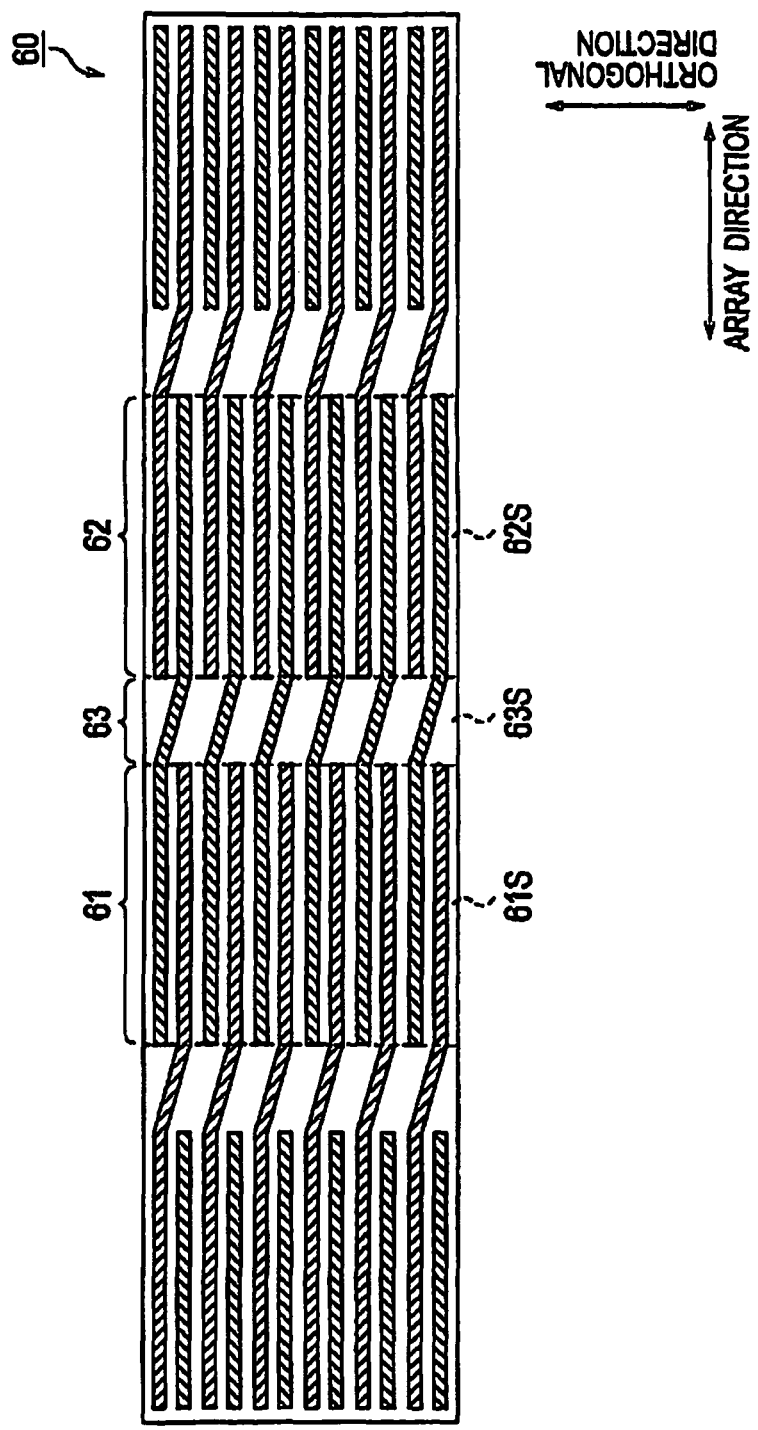
FIG. 19 is a top view of a connection member 60 according to the third embodiment.
Figure 20:
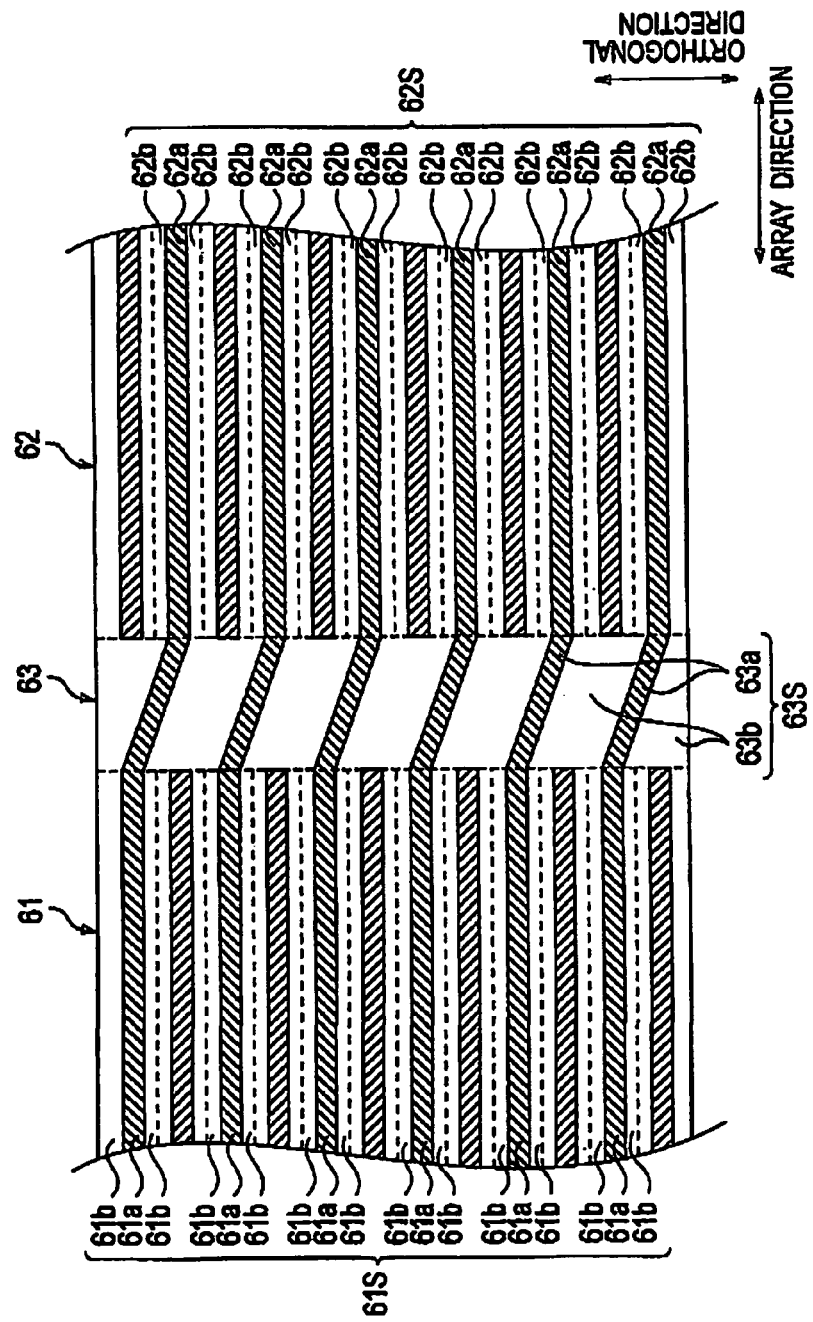
FIG. 20 is a partial enlarged view of FIG. 19.

FIG. 19 is a top view of the connection member 60 according to the third embodiment. FIG. 20 is a partially enlarged view of FIG. 19. As shown in FIG. 19, the connection member 60 has a first section 61, a second section 62, and a third section 63. In the third embodiment, the first section 61, the second section 62, and the third section 63 are integrally formed by using an insulating material as a base material.

The first section 61 has a first surface 61S to be bonded to the back surface of the photoelectric conversion part 30 included in one solar cell 10. As shown in FIG. 20, the first surface 61S includes first conductive regions 61*a* having conductivity and first insulating regions 61*b* having insulation properties. In the third embodiment, each first conductive region 61*a* has a shape corresponding to the n-side electrode 32 included in the one solar cell 10 (see FIG. 4). Specifically, the first conductive region 61*a* has a length equivalent to the width of the one solar cell 10 in the arranging direction. The first conductive region 61*a* is electrically connected to the n-side electrode 32 included in the one solar cell 10.

The second section 62 has a second surface 62S to be bonded to the back surface of the photoelectric conversion part 30 included in a different solar cell 10. The second surface 62S includes second conductive regions 62*a* having conductivity and second insulating regions 62*b* having insulation properties. Each second conductive region 62*a* has a shape corresponding to the p-side electrode 34 included in the different solar cell 10 (see FIG. 4). Specifically, the second conductive region 62*a* has a length equivalent to the width of the different solar cell 10 in the arranging direction. The second conductive region 62*a* is electrically connected to the p-side electrode 34 included in the different solar cell 10.

The third section 63 is a portion of the connection member 60, the portion sandwiched by the first section 61 and the second section 62. The third section 63 has a third surface 63S to be exposed between the one solar cell 10 and the different solar cell 10 (see FIG. 18). The third surface 63S includes third conductive regions 63*a* having conductivity and third insulating regions 63*b* having insulation properties.

Now, as shown in FIG. 20, the first conductive regions 61*a* and the second conductive regions 62*a* are electrically connected by the third conductive regions 63*a*.

Figure 21:
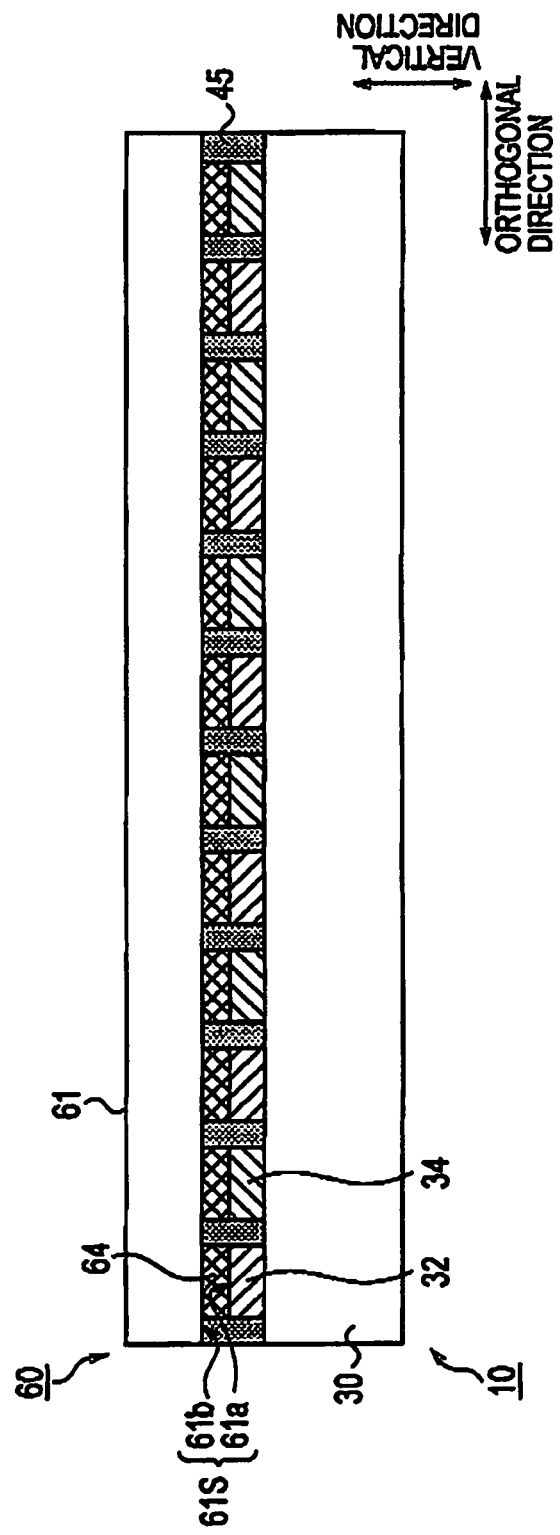
FIG. 21 is a T-T sectional view of FIG. 18.

FIG. 21 is a T-T sectional view of FIG. 18. As shown in FIG. 21, the first section 61 of the connection member 60 has conductors 64 formed on a base material (insulating material) of the connection member 60. The first conductive region 61*a* is composed of a surface of each conductors 64. The first conductive region 61*a* faces the n-side electrode 32 included in the one solar cell 10. The first insulating region 61*b* is composed of a surface of the base material of the connection member 60.

Here, adhesion layers 45 are provided between the one solar cell 10 and the first section 61. The adhesion layers 45 bond the first section 61 to the one solar cell 10. As the adhesion layers 45, a resin adhesive having insulation properties can be used. In the third embodiment, the conductors 64 are in direct contact not only with the n-side electrodes 32, but also with the p-side electrodes 34. Thus, the adhesion layers 45 do not have to have conductivity in a vertical direction. Specifically, as the adhesion layer 45, a two-liquid reaction type adhesive or the like obtained by mixing an epoxy resin, an acrylic resin or a urethane resin with a curing agent can be used, in addition to a thermosetting resin adhesives such as an acrylic resin, a highly flexible polyurethane series.

FIG. 22 is an U-U sectional view of FIG. 18. As shown in FIG. 22, the second section 62 of the connection member 60 has the conductors 64 formed on a base material (insulating material) of the connection member 60. The second conductive region 62a is composed of the surface of conductor 64. The second conductive region 62a faces the p-side electrode 34 included in the different solar cell 10. The second insulating regions 62b are composed of the surface of the base material of the connection member 60.

In addition, the adhesion layers 45 are also provided between the different solar cell 10 and the second section 62. In the third embodiment, the conductors 64 are in direct contact not only with the p-side electrodes 34, but also with the n-side electrodes 32.

(Operations and Effects)

In the third embodiment, the first conductive region 61a is formed along the n-side electrode 32 included in the one solar cell 10, and electrically connected to the n-side electrode 32. The second conductive region 62a is formed along the p-side electrode 34 included in the different solar cell 10, and electrically connected to the p-side electrode 34. The first conductive region 61a and the second conductive region 62a are electrically connected.

Thus, the n-side electrode 32 can be formed over substantially the whole length of the one solar cell 10, and the p-side electrode 34 can be formed over substantially the whole length of the different solar cell 10. Consequently, carriers can be efficiently collected from the one solar cell 10 and the different solar cell 10.

In addition, in the third embodiment, the first section 61 covers substantially the whole region of the back surface of the photoelectric conversion part 30 included in the one solar cell 10, while the second section 62 covers substantially the whole region of the back surface of the photoelectric conversion part 30 included in the different solar cell 10. Thus, when the connection member 60 is attached to the solar cell 10, pressure can be uniformly applied to the entire solar cell 10. Thus, this can suppress any damage of the solar cell 10.

Additionally, in the third embodiment, the connection member 60 serves as a supporting member for the plurality of solar cells 10. Specifically, the connection member 60 covers substantially the whole region of the back surface of the photoelectric conversion part 30 of each solar cell 10. Thus, adhesion of the plurality of solar cells 10 onto the connection member 60 facilitates handling of the solar cells 10 during the manufacturing processes. This can also prevents any crack or chip in the solar cells 10 during manufacturing processes.

Further, in the third embodiment, the first section 61 and the second section 62 are integrally formed. Arrangement of the one solar cell 10 on the first section 61 and of the different solar cell 10 on the second section 62 enables the one solar cell 10 and the different solar cell 10 to be electrically connected. Thus, the manufacturing process of the solar cell module 3 can be simplified.

Furthermore, in the third embodiment, the first conductive region 61a is connected to the n-side electrode 32 included in the one solar cell 10 over substantially the whole length of the n-side electrode 32. Similarly, the second conductive region 62a is connected to the p-side electrode 34 included in the different solar cell 10 over substantially the whole length of the p-side electrode 34. Thus, electric resistance between the n-side electrode 32 and the connection member 60 and between the p-side electrode 34 and the connection member 60 can be reduced.

Other Embodiments

Although the present invention has been described with the embodiments described above, it should not be understood that descriptions and drawings that constitute a part of the disclosure limit the present invention. Various alternative embodiments, modifications, and operational techniques will be apparent to those skilled in the art from this disclosure.

For example, in the above embodiments, although having been described by taking a so-called back surface junction type solar cell as an example, the present invention can be applied to a solar cell on a back surface of which n-side electrodes and p-side electrodes are formed. Specifically, the present invention can be applied to a solar cell having a light receiving surface collecting electrode formed on a light receiving surface, a through hole electrode penetrating a photoelectric conversion part, and a back surface collecting electrode formed on a back surface. In this case, carriers collected by the light receiving surface collecting electrode are carried by the through hole electrode to the back surface side.

In addition, in the above embodiments, although the n-type region 36 and the p-side region 38 are regions formed by diffusing impurities within a semiconductor substrate, the n-type region 36 and the p-type region 38 may be an n-type conductive layer and a p-type conductive layer, respectively.

Additionally, although not specifically mentioned in the above embodiments, a shape of the third conductive region is not limited to those described in the above embodiments. The present invention shall not limit a shape of the third conductive region.

Moreover, although not specifically mentioned in the above embodiments, several hundreds each of the n-side electrodes 32 and the p-side electrodes 34 can be formed on the back surface of the photoelectric conversion part 30 when a solar cell 10, which is 10 cm square, is used.

Further, in the first and second embodiments described above, although the anisotropic conductive film was used as the adhesion layer 40, an insulating resin adhesive may be used. In this case, it is preferable that the n-side electrode and the p-side electrode have a large height. This can bring the n-side electrode into contact with the first conductive region, and bring the p-side electrode into contact with the second conductive region.

Furthermore, in the third embodiment, although four solar cells 10 are arranged on the connection member 60, the number of solar cells 10 to be arranged on the connection member 60 is not be limited to this. For example, one solar cell 10 may be arranged on one connection member 60.

Still furthermore, in the third embodiment described above, although an insulating resin adhesive is used as the adhesion layer 45, it is not be limited to this and an anisotropic conductive adhesive (adhesion layer 40) may also be used.

Thus, it is needless to say that the present invention includes various embodiments or the like not described herein. Hence, a technical scope of the present invention should only be defined by inventive specific matters according to the claims that are reasonable from the above description.

Example

Hereinafter, a solar cell according to the present invention will be described in detail by citing the following examples.

However, the present invention should not be limited to those shown in the following examples, but may be modified appropriately and implemented within a range not deviating from the gist thereof.

Example

First, an n-type single crystal silicon substrate of 100 mm square was washed. Next, a passivation layer was formed on a light receiving surface of the n-type single crystal silicon substrate. Then, an i-type amorphous silicon layer was formed on a back surface of the n-type single crystal silicon substrate by using a CVD method.

Then, by using an ink jet method, an n-type coating layer including an n-type diffusion material and a p-type coating layer including a p-type diffusion material were alternately formed in a predetermined direction on the i-type amorphous silicon layer. In this event, both layers were each formed over the whole length of the back surface of the n-type single crystal silicon substrate. An interval between the n-type coating layer and the p-type coating layer was set to 50 μm, and a width of each of the n-type coating layer and the p-type coating layer was set to 150 μm.

Then, the n-type coating layer and the p-type coating layer were irradiated with a YAG laser triple wave. Thus, the n-type diffusion material and the p-type diffusion material were diffused on the n-type single crystal silicon substrate. Thereby, a plurality of n-type regions and a plurality of p-type regions were formed.

Next, by using a screen printing method, a conductive paste, a main constituent of which is silver, was arranged on each n-type region and each p-type region. An interval to arrange the conductive paste was set to 50 μm, and a width of the conductive paste was set to 150 μm.

Next, conductive regions were formed in the pattern shown in FIG. 6, by etching a copper thin film provided on a glass epoxy substrate. An interval between each two conductive regions was set to 250 μm and a width of each conductive region was set to 150 μm.

Next, as shown in FIG. 2, FIG. 7, and FIG. 8, one edge portion of the glass epoxy substrate was pressure bonded to the back surface of one solar cell by using an anisotropic conductive film. Then, a different edge portion of the glass epoxy substrate was pressure bonded to the back surface of a different solar cell by using the anisotropic conductive film. Thereby, the n-type electrodes of the one solar cell and the p-type electrodes of the different solar cell were electrically connected to each other respectively via the glass epoxy substrate. A solar cell string was fabricated by repeating the processes.

A solar cell module according to this example was fabricated by sealing such solar cell string between a glass and a PET film by using EVA.

Comparative Example

In a comparative example, an n-type collector connected to each n-side electrode and p-type collector connected to each p-side electrode were formed on the back surface of an n-type single crystal silicon substrate. The n-type collector of one solar cell and the p-type collector of a different solar cell were connected by wiring members. Other configurations were similar to the illustrative embodiments.

(Output Measurement)

Output of the solar cell module according to this example and that of the solar cell module according to the comparative example were measured.

As a result of the measurement, in this example, the output was improved by 1% as compared with the comparative example. This is because the n-type electrodes and the p-type electrodes were able to be formed over the whole region of the back surface in this example. On the other hand, in the comparative example, since the n-type collectors and the p-type collectors were formed, collection efficiency of carriers was reduced. Based on the above, it was confirmed that carriers were able to be efficiently collected from solar cells with the solar cell module according to this example.

What is claimed is:

1. A solar cell module comprising:
first and second solar cells arranged in a predetermined direction; and
a connection member configured to electrically connect the first and second solar cells, the connection member having a width extending in the predetermined direction and a height extending in a direction crossing the predetermined direction, the connection member having an insulating substrate and a conductive body that is formed on the insulating substrate and on a surface facing the first and second solar cells, such that a first portion of the conductive body is sandwiched between the first solar cell and the insulating substrate, and such that a second portion of the conductive body separate from the first portion is sandwiched between the second solar cell and the insulating substrate, wherein
each of the first and second solar cells includes:
a photoelectric conversion part having a light receiving surface and a back surface provided on an opposite side to the light receiving surface;
n-side electrodes on the back surface of the photoelectric conversion part; and
p-side electrodes on the back surface of the photoelectric conversion part,
the connection member includes:
a first section having a first surface opposed to the back surface of the photoelectric conversion part included in the first solar cell; and
a second section having a second surface opposed to the back surface of the photoelectric conversion part included in the second solar cell,
the conductive body includes a plurality of first conductive regions provided on the first surface and extending along the width of the connection member in the predetermined direction along the n-side electrodes included in the first solar cell and facing the n-side electrodes, the plurality of first conductive regions being spaced apart from each other in the direction crossing the predetermined direction, and
the insulating substrate includes a plurality of first insulating regions formed on the first surface and being alternatively arranged with respect to the plurality of first conductive regions in the direction crossing the predetermined direction, such that one of the first conductive regions is sandwiched between an adjacent two of the plurality of first insulating regions in the direction crossing the predetermined direction and such that the plurality of first insulating regions do not overlap any of the plurality of first conductive regions, the plurality of first insulating regions directly physically contacting via resin the p-side electrodes on the back surface of the first solar cell,
the conductive body includes a plurality of second conductive regions provided on the second surface and extending along the width of the connection member in the predetermined direction along the p-side electrodes included in the second solar cell and electrically contacting the p-side electrodes of the second solar cell, the plurality of second conductive regions being spaced apart from each other in the direction crossing the predetermined direction, and the insulating substrate includes a plurality of second insulating regions formed on the second surface and being alternatively arranged with respect to the plurality of second conductive regions in the direction crossing the predetermined direction, such that one of the second conductive regions is sandwiched between an adjacent two of the plurality of second insulating regions in the direction crossing the predetermined direction and such that the plurality of second insulating regions do not overlap any of the plurality of second conductive regions, the plurality of second insulating regions directly physically contacting via resin the n-side electrodes on the back surface of the second solar cell, each first conductive region is electrically connected to each n-side electrode included in the first solar cell and each first insulating region physically contacts one of the p-side electrodes included in the first solar cell, each second conductive region is electrically connected to each p-side electrode included in the second solar cell and each second insulating region physically contacts one of the n-side electrodes included in the second solar cell, and each first conductive region and each second conductive region are electrically connected to each other.

2. The solar cell module according to claim 1, further comprising an adhesion layer provided between the connection member and the first solar cell or between the connection member and the second solar cell, wherein
a base material of the adhesion layer is a resin material having insulation properties.

3. The solar cell module according to claim 2, wherein the adhesion layer includes a plurality of particles having conductivity, and
the adhesion layer has vertical conductivity but lacks horizontal conductivity.

4. The solar cell module according to claim 3, wherein a diameter of each of the plurality of particles is smaller than an interval between the n-side electrode and the p-side electrode included in the first solar cell, and smaller than an interval between the n-side electrode and the p-side electrode included in the second solar cell.

5. The solar cell module according to claim 1, wherein
each first conductive region is surrounded by an adjacently-positioned two of the first insulating regions on the first surface spaced apart from each other in the direction crossing the predetermined direction, the first insulating regions each formed along the first conductive region and having insulation properties, and
each second conductive region is surrounded by an adjacently-positioned two of the second insulating regions on the second surface spaced apart from each other with respect to the direction crossing the predetermined direction, the second insulating regions each formed along the second conductive region and having insulation properties.

6. The solar cell module according to claim 1, wherein the connection member includes a third section formed of a conducting material,
the third section is electrically connected to the first section and the second section, and an insulating resin material is arranged between the third section and the first solar cell and between the third section and the second solar cell.

7. The solar cell module according to claim 1, wherein the first and second sections are formed integrally.

8. A solar cell module as described in claim 1, wherein:
each first conductive region is coextensive with a corresponding n-side electrode;
each second conductive region is coextensive with a corresponding p-side electrode,
the corresponding n-side electrode is the n-side electrode, and
the corresponding p-side electrode is the p-side electrode.

9. A solar cell module having two or more solar cells with connections between them located completely on a back surface opposite a light receiving surface comprising:
first and second solar cells arranged in a common plane wherein each of the first and second solar cells includes:
a photoelectric conversion part having a light receiving surface and a back surface provided on an opposite side to the light receiving surface;
n-side electrodes formed in a first pattern on the back surface of each photoelectric conversion part; and
p-side electrodes formed in a second pattern on the back surface of each photoelectric conversion part; and
a connection member in contact with the rear surface of and configured to electrically connect the first and second solar cells, the connection member having a width extending in a predetermined direction and a height extending in a direction crossing the predetermined direction; the connection member having an insulating substrate and a conductive body that is formed on the insulating substrate and on a surface facing the first and second solar cells, such that a first portion of the conductive body is sandwiched between the first solar cell and the insulating substrate, and such that a second portion of the conductive body separate from the first portion is sandwiched between the second solar cell and the insulating substrate, and
an adhesion layer with regions of vertical conductivity that correspond with the first and second patterns in a manner to selectively connect the n-side electrodes from the first solar cell to the p-side electrodes from the second solar cell,
wherein the connection member includes:
a first section having a first surface opposed to the back surface of the photoelectric conversion part included in the first solar cell; and
a second section having a second surface opposed to the back surface of the photoelectric conversion part included in the second solar cell
the conductive body includes a plurality of first conductive regions provided on the first surface and extending along the width of the connection member in the predetermined direction along the n-side electrodes included in the first solar cell and facing the n-side electrodes, the plurality of first conductive regions being spaced apart from each other in the direction crossing the predetermined direction, and
the insulating substrate includes a plurality of first insulating regions formed on the first surface and being alternatively arranged with respect to the plurality of first conductive regions in the direction crossing the predetermined direction, such that one of the first conductive regions is sandwiched between an adjacent two of the plurality of first insulating regions in the direction crossing the predetermined direction and such that the plurality of first insulating regions do not overlap any of the plurality of first conductive regions, the plurality of first insulating regions directly physically contacting via resin the p-side electrodes on the back surface of the first solar cell, the conductive body includes a plurality of second conductive regions provided on the second surface and extending along the width of the connection member in the predetermined direction along the p-side electrodes included in the second solar cell and electrically contacting the p-side electrodes, the plurality of second conductive regions being spaced apart from each other in the direction crossing the predetermined direction, and the insulating substrate includes a plurality of second insulating regions formed on the second surface and being alternatively arranged with respect to the plurality of second conductive regions in the direction crossing the predetermined direction, such that one of the second conductive regions is sandwiched between an adjacent two of the plurality of second insulating regions in the direction crossing the predetermined direction and such that the plurality of second insulating regions do not overlap any of the plurality of second conductive regions, the plurality of second insulating regions directly physically contacting via resin the n-side electrodes on the back surface of the second solar cell, each first conductive region is electrically connected to each n-side electrode included in the first solar cell and each first insulating region physically contacts one of the p-side electrodes included in the first solar cell, each second conductive region is electrically connected to each p-side electrode included in the second solar cell and each second insulating region physically contacts one of the n-side electrodes included in the first solar cell, and each first conductive region and each second conductive region are electrically connected to each other.

10. The solar module of claim 8, wherein the adhesion layer comprises an anisotropic conductive film.

11. The solar panel of claim 8, wherein the adhesion layer comprises conductive particles arranged to provide conductivity in a vertical direction but not in a horizontal direction.

12. A solar cell module as described in claim 1, wherein each first conductive region has a first end and a second end extending along the predetermined direction in a manner such that the first end of each of the first conductive regions closest to the first solar cell is disposed higher with respect to the height direction of the connection member than the second end of each of the first conductive regions closest to the second solar cell.

13. A solar cell module as described in claim 1, wherein each first insulating region has a first end and a second end extending along the predetermined direction in a manner such that the first end of each of the first insulating regions closest to the first solar cell is disposed higher with respect to the height direction of the connection member than the second end of each of the first insulating regions closest to the second solar cell.

14. A solar cell module as described in claim 1, wherein a gap exists between adjacent ones of the first conductive regions in the direction crossing the predetermined direction, and wherein a gaps exists between adjacent ones of the second conductive regions in the direction crossing the predetermined direction.

15. A solar cell module as described in claim 9, wherein a gap exists between adjacent ones of the first conductive regions in the direction crossing the predetermined direction, and wherein a gaps exists between adjacent ones of the second conductive regions in the direction crossing the predetermined direction.

16. A solar cell module as described in claim 1, wherein the conductive body is sandwiched between the first and second solar cells on one side thereof, and the insulating substrate on an opposite side thereof.

17. A solar cell module as described in claim 9, wherein the conductive body is sandwiched between the first and second solar cells on one side thereof, and the insulating substrate on an opposite side thereof.

* * * * *